United States Patent
Ausschnitt et al.

(10) Patent No.: US 9,087,740 B2
(45) Date of Patent: Jul. 21, 2015

(54) FABRICATION OF LITHOGRAPHIC IMAGE FIELDS USING A PROXIMITY STITCH METROLOGY

(71) Applicant: International Business Machines Corporation, Armonk, NY (US)

(72) Inventors: Christopher P. Ausschnitt, Naples, FL (US); Jaime D. Morillo, Cedar Park, TX (US); Roger J. Yerdon, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 14/100,297

(22) Filed: Dec. 9, 2013

(65) Prior Publication Data

US 2015/0162249 A1   Jun. 11, 2015

(51) Int. Cl.
  *G06F 17/50*   (2006.01)
  *H01L 21/66*   (2006.01)

(52) U.S. Cl.
  CPC ............ *H01L 22/12* (2013.01); *G06F 17/5081* (2013.01)

(58) Field of Classification Search
  CPC ....... G03F 1/44; G06F 17/5068; G06F 17/50; G06F 17/5009; G06F 2217/10; G06F 2217/86; H01L 21/682; Y10S 430/143; Y10S 430/146
  USPC ..................................................... 716/50–56
  See application file for complete search history.

(56) References Cited

U.S. PATENT DOCUMENTS

| | | | |
|---|---|---|---|
| 5,757,507 A | 5/1998 | Ausschnitt et al. | |
| 6,350,548 B1 | 2/2002 | Leidy et al. | |
| 6,498,685 B1 | 12/2002 | Johnson | |
| 6,638,671 B2 | 10/2003 | Ausschnitt et al. | |
| 7,019,814 B2 | 3/2006 | Best et al. | |
| 7,688,423 B2 | 3/2010 | Bleeker et al. | |
| 7,958,482 B2 | 6/2011 | Leidy et al. | |
| 7,987,057 B1 | 7/2011 | DiBiase | |
| 8,107,079 B2 | 1/2012 | Ausschnitt et al. | |
| 8,339,605 B2 | 12/2012 | Ausschnitt et al. | |
| 2004/0265710 A1* | 12/2004 | Kohler et al. ..................... 430/5 |
| 2006/0008716 A1* | 1/2006 | Jeunink et al. ................. 430/30 |
| 2007/0072091 A1* | 3/2007 | Smith et al. ...................... 430/5 |
| 2010/0123886 A1 | 5/2010 | Bijnen et al. | |
| 2011/0248388 A1 | 10/2011 | Ausschnitt et al. | |
| 2012/0082938 A1 | 4/2012 | Fabinski et al. | |

* cited by examiner

*Primary Examiner* — Binh Tat
(74) *Attorney, Agent, or Firm* — Keivan Razavi; Yuanmin Cai

(57) ABSTRACT

A method of determining stitching errors in multiple lithographically exposed fields on a semiconductor layer during a semiconductor manufacturing process is provided. The method may include receiving a predetermined design distance corresponding to a plurality of petals associated with the multiple lithographically exposed fields and identifying a blossom within a single field-of-view (FOV) of a metrology tool, where the blossom is formed by a non-overlapping abutment of corners corresponding to the multiple lithographically exposed fields. The blossom may include the plurality of petals associated with the multiple lithographically exposed fields. Petal position errors may then be calculated based on both a coordinate position for each of the plurality of petals within the blossom and the predetermined design distance, whereby the calculated petal position errors are indicative of stitching errors for the multiple lithographically exposed fields.

17 Claims, 11 Drawing Sheets

PPE12 = (x1 + Do – x2, y1-y2)

FABRICATION OF LITHOGRAPHIC IMAGE FIELDS USING A PROXIMITY STITCH METROLOGY

BACKGROUND a. Field of the Invention

The present invention generally relates to semiconductor manufacturing, and more particularly to the positioning of multiple exposure fields during semiconductor manufacturing.

b. Background of Invention

Within the field of photolithography, the accurate placement of exposed image fields over a semiconductor layer may be of paramount importance, especially since one or more additional layers may subsequently be fabricated over this layer. Intra-layer positioning or field stitching may, therefore, involve the placement of lithographically generated images (i.e., exposed fields) relative to each other over a shared layer of a semiconductor wafer. Thus, in some implementations, multiple semiconductor device (e.g., a processor chip) exposures may be replicated on the semiconductor wafer surface with, for example, some field region overlap.

Accordingly, different techniques associated with positioning each exposed field relative to its adjacent field(s) may be realized using, for example, predetermined pattern images (i.e., petals) located on each of the exposed images. Using metrology tools, the generated predetermined pattern images may be utilized in order to ascertain alignment errors between multiple exposed fields. If these ascertained alignment errors falls outside certain tolerances, a lithographic re-work of the layer may be needed, whereby the patterned photoresist is stripped, another photoresist layer is reapplied, and the fields are lithographically re-exposed on the newly applied photoresist layer.

BRIEF SUMMARY

According to one or more embodiments, it may be advantageous, among other things, to provide wafer stitching between exposure fields that do not overlap. Thus, petal positioning and blossom creation (i.e., arrangement of petals) facilitate an increased field-usage area since there is no overlap. Moreover, as a result of the eliminated overlap, extreme ultraviolet (EUV) flare during EUV lithography may be mitigated.

According to at least one exemplary embodiment, a method of stitching multiple lithographically exposed fields on a semiconductor layer during a semiconductor manufacturing process is provided. The method may include exposing a first lithographic field image on the semiconductor layer, whereby the first lithographic field image has a first petal located substantially adjacent a peripheral edge of the first lithographic field image; exposing a second lithographic field image on the semiconductor layer, whereby the second lithographic field image has a second petal located substantially adjacent a peripheral edge of the second lithographic field image; exposing a third lithographic field image on the semiconductor layer, whereby the third lithographic field image has a third petal located substantially adjacent a peripheral edge of the third lithographic field image; and exposing a fourth lithographic field image on the semiconductor layer, whereby the fourth lithographic field image has a fourth petal located substantially adjacent a peripheral edge of the fourth lithographic field image. The peripheral edge of the first, the second, the third, and the fourth lithographic field substantially abut in a non-overlapping manner based on a predetermined design distance between the first, the second, the third, and the fourth petal. The first, the second, the third, and the fourth petal are, thus, captured within a field-of-view (FOV) of a metrology tool for determining a stitching error between the first, the second, the third, and the fourth lithographic field image.

According to at least one other exemplary embodiment, a method of determining stitching errors in multiple lithographically exposed fields on a semiconductor layer during a semiconductor manufacturing process is provided. The method may include receiving a predetermined design distance corresponding to a plurality of petals associated with the multiple lithographically exposed fields and identifying a blossom within a single field-of-view (FOV) of a metrology tool. The blossom may be formed by a non-overlapping abutment of corners corresponding to the multiple lithographically exposed fields, whereby the blossom includes the plurality of petals associated with the multiple lithographically exposed fields. Petal position errors are then calculated based on both a coordinate position for each of the plurality of petals within the blossom and the predetermined design distance. The calculated petal position errors are, thus, indicative of stitching errors for the multiple lithographically exposed fields.

According to yet another exemplary embodiment, a computer system for determining stitching errors in multiple lithographically exposed fields on a semiconductor layer during a semiconductor manufacturing process is provided. The computer system may include a memory and a processor in communication with the memory, whereby the processor may have an instruction fetching unit for fetching instructions from memory and one or more execution units for executing fetched instructions. The computer system may be capable of performing a method including receiving a predetermined design distance corresponding to a plurality of petals associated with the multiple lithographically exposed fields and identifying a blossom within a single field-of-view (FOV) of a metrology tool. The blossom may be formed by a non-overlapping abutment of corners corresponding to the multiple lithographically exposed fields, whereby the blossom includes the plurality of petals associated with the multiple lithographically exposed fields. Petal position errors are then calculated based on both a coordinate position for each of the plurality of petals within the blossom and the predetermined design distance. The calculated petal position errors are, thus, indicative of stitching errors for the multiple lithographically exposed fields.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
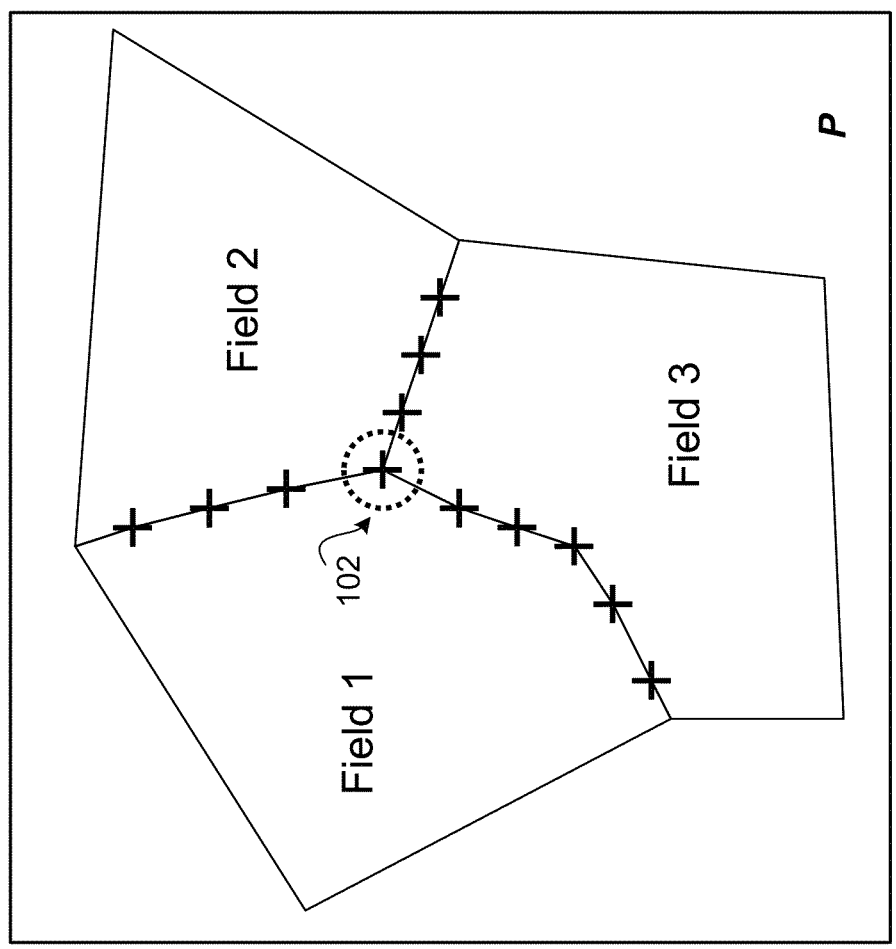
FIG. 1A illustrates a generalized wafer stitching concept as conventionally known.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1A, for example, illustrates a basic stitching concept, whereby lithographically exposed image Fields 1, 2, & 3 are stitched together within plane P. As depicted, the image fields may be positioned adjacent to each other using the '+' shaped positioning images referred to as petals. For example, at position 102 where all three Fields 1, 2, & 3 intersect, the petals associated with each of Fields 1, 2, & 3 may be aligned using a lithography tool to substantially overlap. Any errors in this alignment may subsequently be determined using a metrology tool.

Figure 1B:
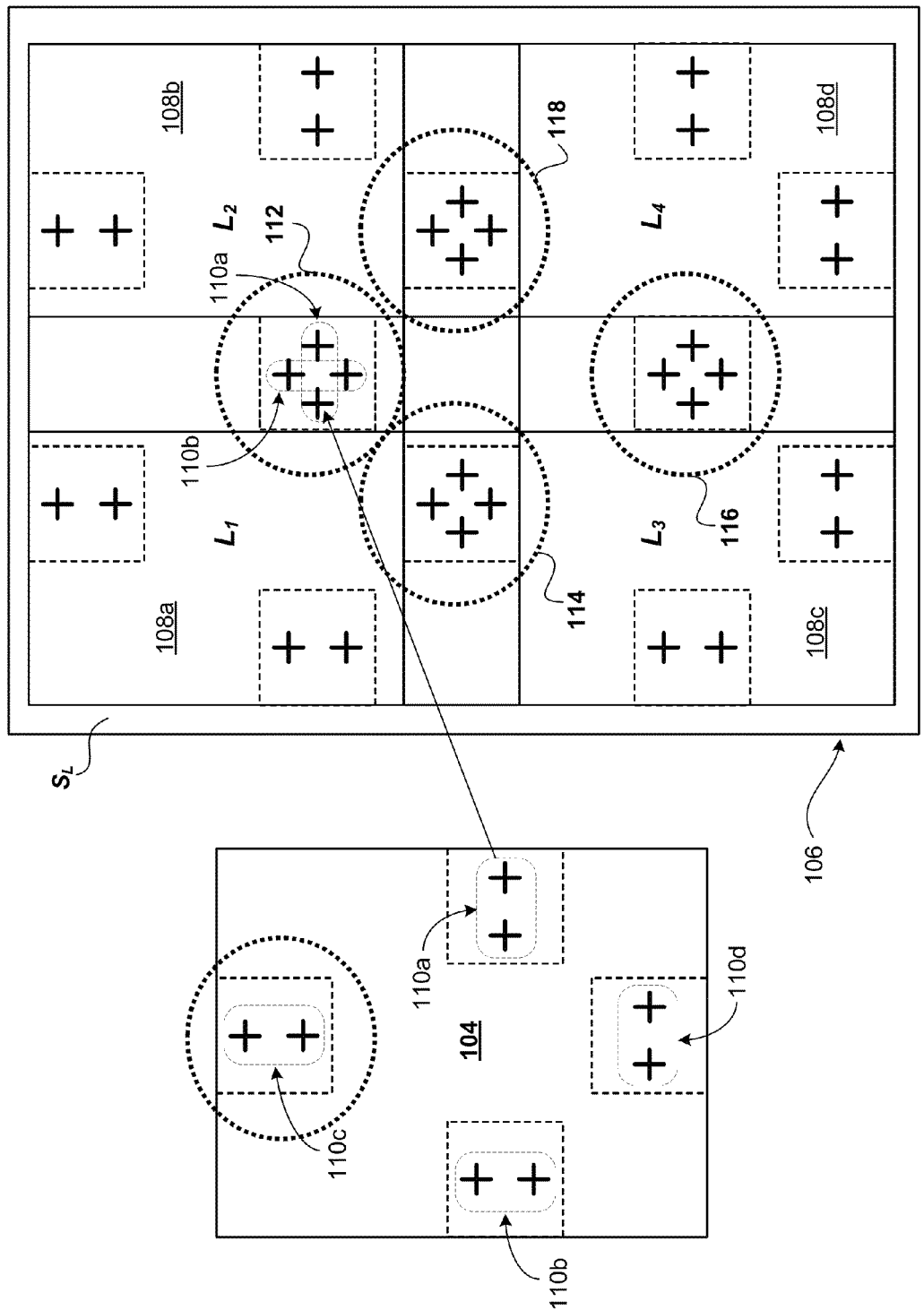
FIG. 1B illustrates an exemplary embodiment of a conventionally known wafer stitching structure.

FIG. 1B refers to an exemplary method of stitching an image 104 generated by a reticle at four locations $L_1$, $L_2$, $L_3$, $L_4$ of a layer $S_L$ of a semiconductor wafer 106. As depicted, the field stitching of image 104 by lithographic exposure and stepping using the lithography tool generates exposure fields 108a-108d. As illustrated, image 104 includes petals 110a-110d. Accordingly, during stitching, petals 110a of field 108a may be aligned with respect to petals 110b of field 108b to create blossom 112. Similarly, petals 110d of field 108a may be aligned with respect to petals 110c of field 108c to create blossom 114, while petals 110a of field 108c may be aligned with respect to petals 110b of field 108d to create blossom 116. Also, petals 110d of field 108b may be aligned with respect to petals 110c of field 108d to create blossom 118. The fields stitched in this manner therefore overlap to create the blossoms. The metrology tool may subsequently utilize these blossoms (e.g., 112) to measure any errors in the positioning (i.e., stitching) of the exposure fields (e.g., fields 108a & 108b) with respect to one another.

Although the overlapping nature of this type of field stitching allows the metrology tool to investigate the symmetry of the generated blossoms and facilitate positioning errors between the fields using the petals within the blossoms, certain limitation may occur. For example, four metrology steps for each of the blossoms may be required to determine positioning errors based on a two-field overlay that occurs at each blossom.

Figure 1C:
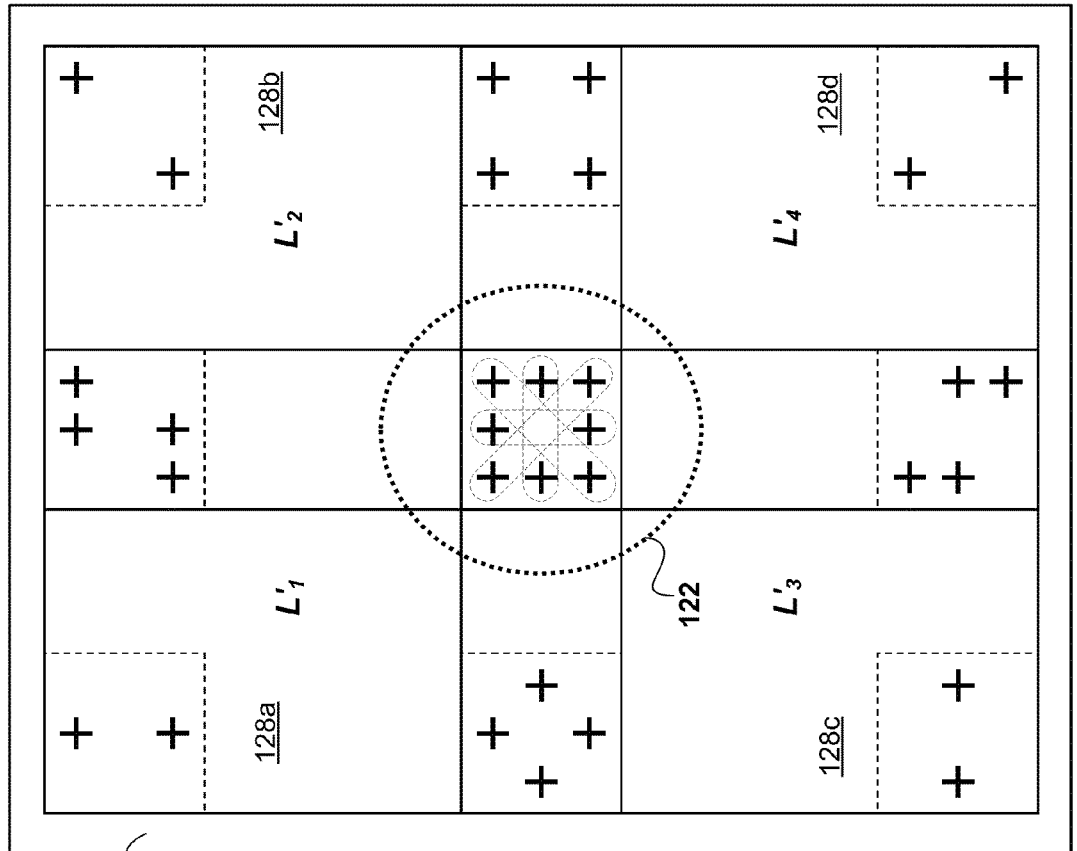
FIG. 1C illustrates another exemplary embodiment of a conventionally known wafer stitching structure.
Figure 1C:
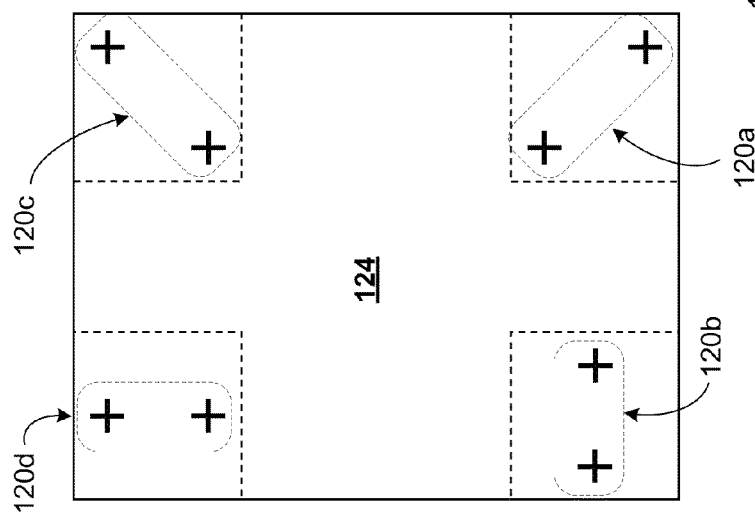

FIG. 1C refers to another exemplary method of stitching an image 124 generated by a reticle at four locations $L'_1, L'_2, L'_3, L'_4$ of a layer $S'_L$ of a semiconductor wafer 125. As depicted, the field stitching of image 124 by lithographic exposure and stepping using the lithography tool generates exposure fields 128a-128d. As illustrated, image 124 includes petals 120a-120d. Accordingly, during stitching, petals 120a-120d of respective fields 128a-128d may be aligned to create a single blossom 122 formed by a four field overlay. In this stitching methodology, therefore, a single metrology step may utilize blossom 122 to ascertain positioning errors between stitched exposure fields 128a-128d.

However, in both stitching methodologies described above in relation to FIGS. 1B and 1C, there is field overlapping. For example, in FIG. 1B, the stitching methodology includes a two-field overlapping process, while in FIG. 1C, the stitching methodology includes a four-field overlapping process. As lithography tools evolve towards creating smaller device (e.g., FETs) geometries, the generation of blossoms using overlapping fields may accordingly encounter some limitations. For example, Extreme Ultraviolet (EUV) lithography may generate flare on a photoresist layer during field exposure when the stitching methodology involves petal placements that incorporate overlapping fields (e.g., FIG. 1B or 1C). Moreover, the overlapping fields may accordingly reduce field usage area.

Figure 2:
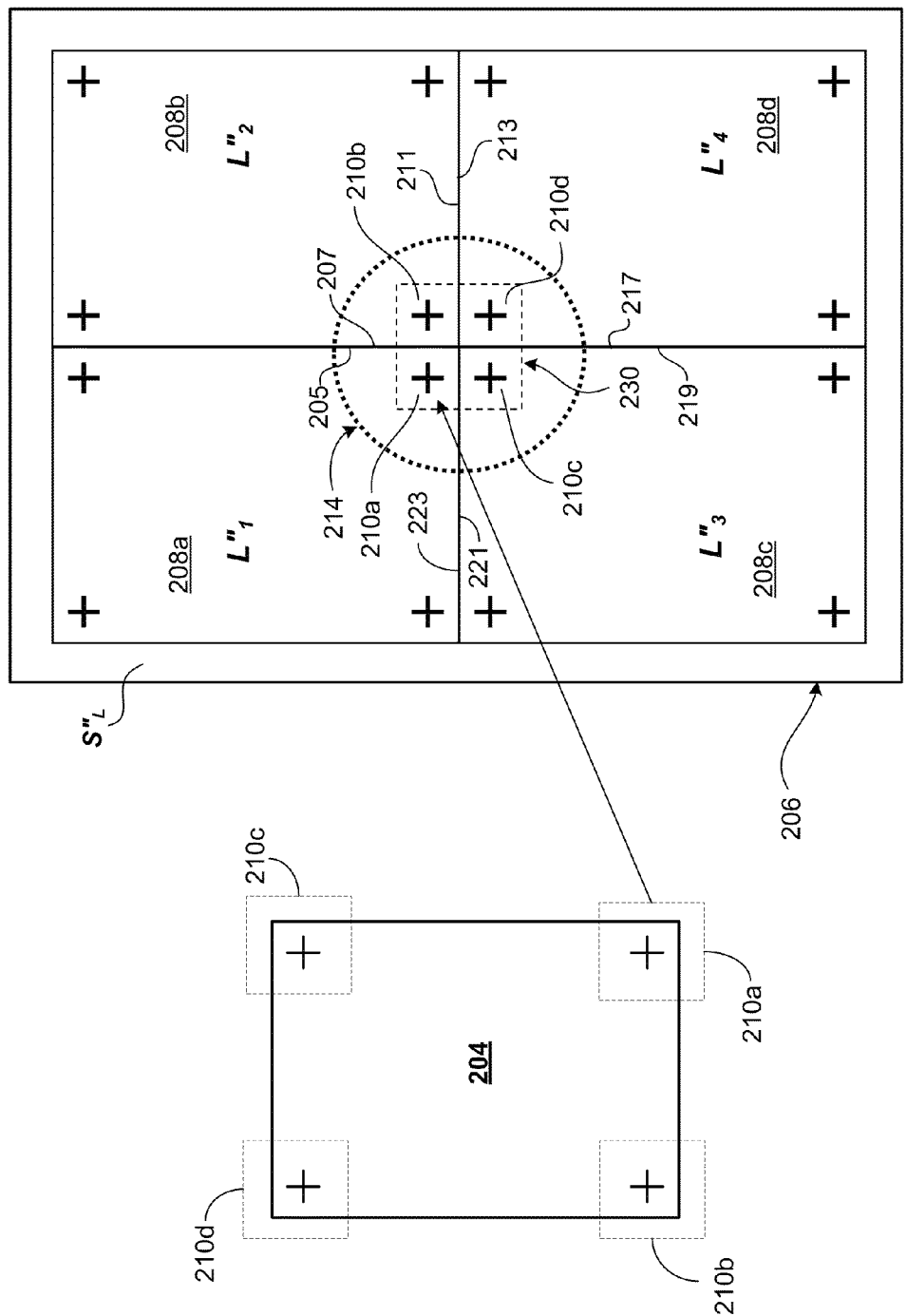
FIG. 2 illustrates a wafer stitching structure according to one embodiment.

FIG. 2 illustrates an exemplary method of stitching an image 204 generated by a reticle at four locations $L''_1, L''_2, L''_3, L''_4$ of a layer $S''_L$ of a semiconductor wafer 206, according to one embodiment. As depicted, the field stitching of image 204 by lithographic exposure and stepping using the lithography tool generates exposure fields 208a-208d. As illustrated, image 204 includes petals 210a-210d. Accordingly, during stitching, petal 210a of field 208a is positioned adjacent petal 210b of field 208b, whereby edge 205 of field 208a is substantially abutted in a non-overlapping manner with respect to edge 207 of field 208b. Also, petal 210b of field 208b is positioned adjacent petal 210d of field 208d, whereby edge 211 of field 208b is substantially abutted in a non-overlapping manner with respect to edge 213 of field 208d. Moreover, during stitching, petal 210d of field 208d is positioned adjacent petal 210c of field 208c, whereby edge 217 of field 208d is substantially abutted in a non-overlapping manner with respect to edge 219 of field 208c. Also, during stitching, petal 210c of field 208c is positioned adjacent petal 210a of field 208a, whereby edge 221 of field 208c is substantially abutted in a non-overlapping manner with respect to edge 223 of field 208a. Thus, the adjacent petals 210a-210d of respective non-overlapping fields 208a-208d form a single blossom 214.

As depicted, the petals are located adjacent a peripheral edge of each of the exposure fields. Accordingly, petal 210a is located adjacent a peripheral edge formed by edges 205 and 223, petal 210b is located adjacent a peripheral edge formed by edges 207 and 211, petal 210c is located adjacent a peripheral edge formed by edges 219 and 221, and petal 210d is located adjacent a peripheral edge formed by edges 213 and 217.

A metrology tool may subsequently utilize this blossom (e.g., 214) to measure any errors in the positioning (i.e., stitching) of the exposure fields (e.g., fields 208a-208d) with respect to one another. More particularly, the single blossom 214 may be imaged within the field-of-view (FOV) 230 of the metrology tool for determining any errors associated with the stitching of exposed fields 208a-208d. For example, the FOV 230 of the metrology tool may include about a 35 μm by 35 μm window. As described in the following, petals 210a-210d may provide a position error indication based on the abutment of the peripheral edges of the exposure fields 208a-208d. For example, an error may indicate a deviation from a substantial abutment, whereby the deviation may be either in the form of some overlap between the fields of a separation between the fields.

Figure 3:
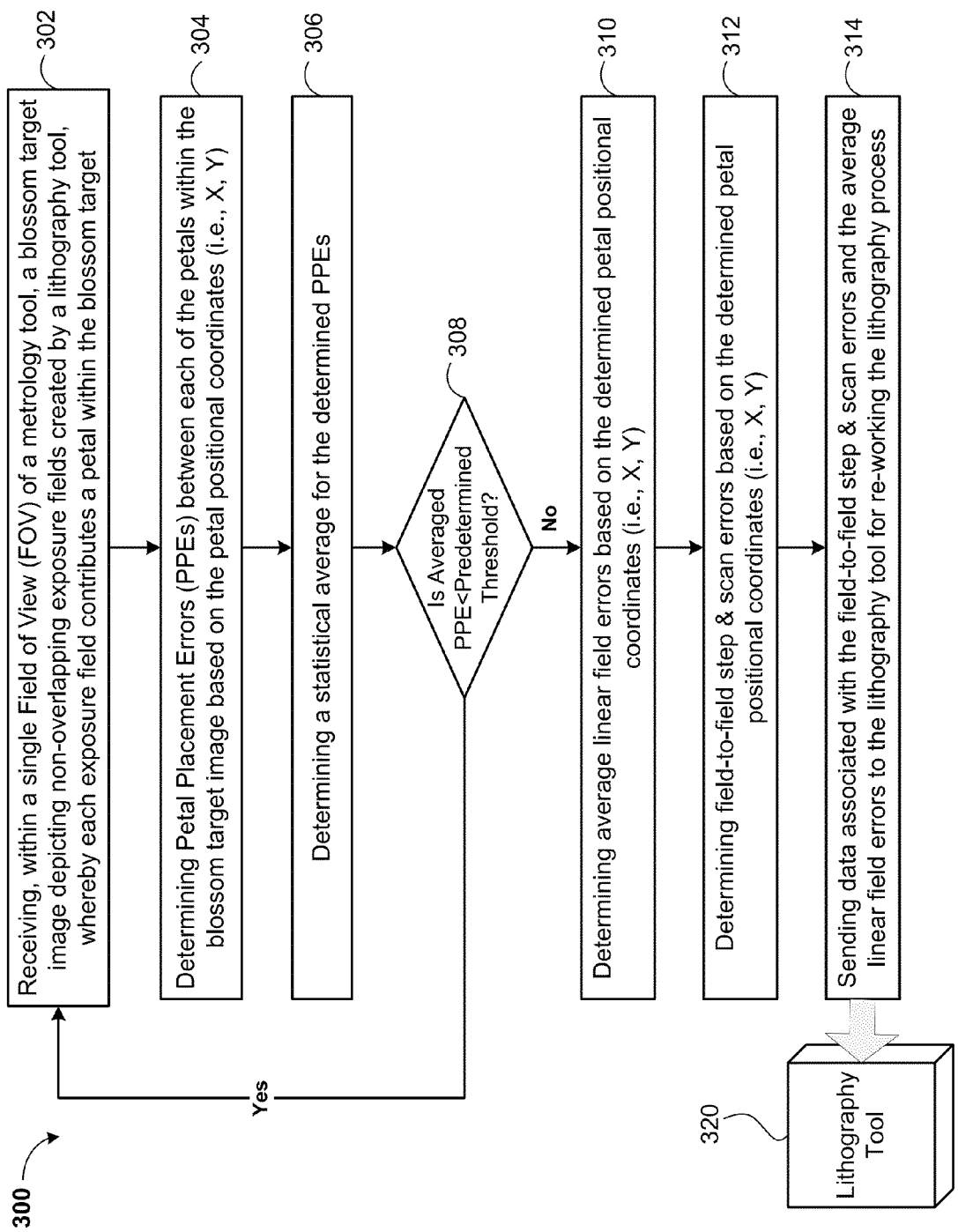
FIG. 3 is a process flow diagram for determining errors associated with a lithographic field exposure stitching process according to one embodiment.

Referring to FIG. 3, a process flow diagram 300 (i.e., Wafer Stitch (WFS) Program) for determining errors associated with a lithographic field exposure stitching process is depicted. At 302, within a single FOV of a metrology tool, a blossom target image depicting substantially non-overlapping exposure fields created by a lithography tool may be received. For example, referring to FIG. 2, using a lithography tool, substantially non-overlapping exposure fields 208a-208d may be created, whereby the blossom 214 formed from the respective petals 210a-210d of the exposure fields 208a-208d may be captured within the single FOV 230 of the metrology tool.

Figure 4A:
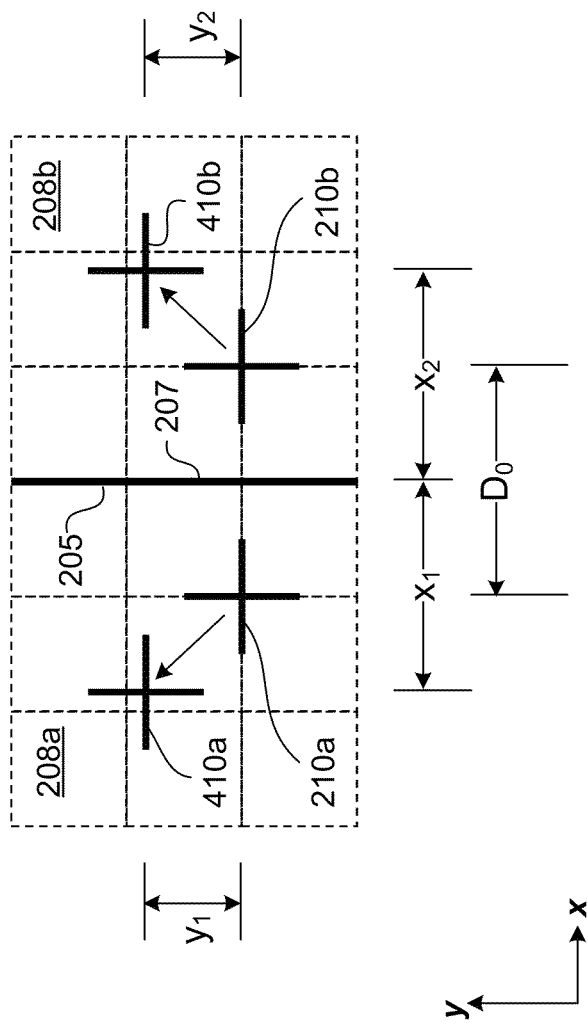
FIG. 4A is an expanded view of adjacent petals used for determining petal placement errors (PPEs) according to one embodiment.

At 304, the petals within the blossom target image (e.g., FIG. 2: 214) corresponding to the exposure fields (e.g., FIG. 2: 208a-208d) may be utilized to determine petal placement errors (PPEs) between the adjacent petals 210a-210d within the blossom image (e.g., FIG. 2: 214). Referring to FIG. 4A, an expanded view of the petals 210a, 210b corresponding to respective exposure fields 208a and 208b for determining a petal placement error (PPE) is depicted. A predetermined design distance $D_0$ between petals 210a and 210b may be ascertained as the required distance between petals 210a and 210b taken from the edge 205, 207 of each field 208a, 208b to form an abutted non-overlapping positional relationship. However, during lithography, stitching errors may occur, whereby these stitching errors manifest as the petals 210a, 210b shifting relative to their predetermined design distance $D_0$. This deviation or petal shift is illustrated by petal images 410a and 410b. For example, a deviation of petal image 210a may result in petal image 410a and a deviation of petal image 210b may result in petal image 410b. In terms of an x, y coordinate system, based on the depicted example, petal images 410a and 410b undergo both a shift along the x axis and a shift along they axis. In the illustrated example, such a shift along the x axis may indicate a separation or gap between the exposure fields 208a, 208b rather than a substantial abutment, as desired. Based on vector arithmetic, the petal placement errors between adjacent petal 210a and 210b of exposure fields 208a and 208b, respectively, may be given by:

$$PPE12 = (x1+D_0-x2, y1-y2) \quad \text{Equation (1)}$$

Where the x axis deviation (i.e., $x1+D_0-x2$) is calculated as a function of the predetermined design distance (i.e., $D_0$), the x-axis position (x1) of petal image 410a, and the x-axis position (x2) of petal image 410b. Since they axes for these petals share a common origin, they axis deviation may be given by y1–y2, which does not include a predetermined design distance. Accordingly, y1 is the y-axis position of petal image 410a, while y2 is the y-axis position of petal image 410b.

Figure 4B:
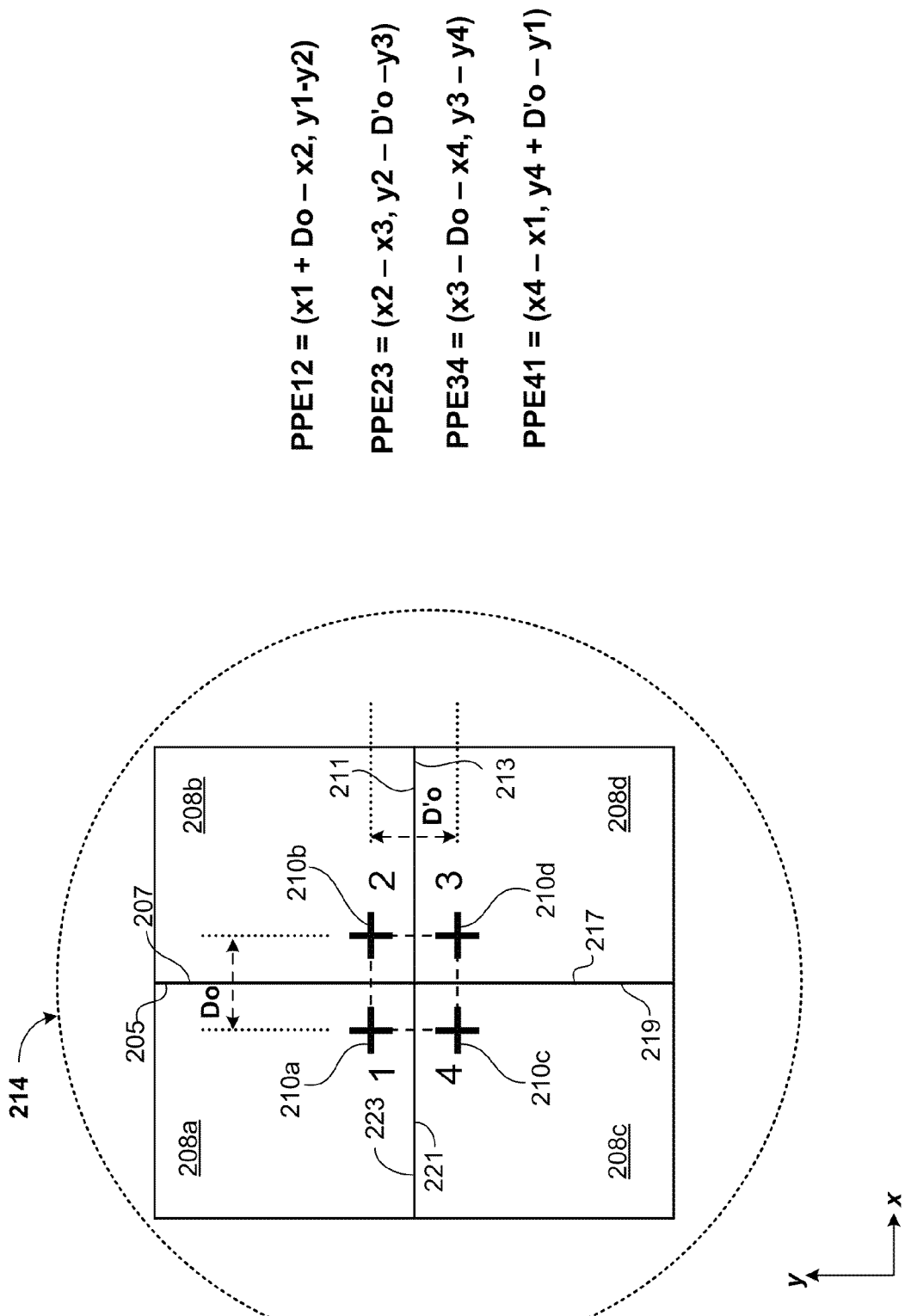
FIG. 4B is an expanded view of a blossom target image including petals corresponding to four exposure fields for determining petal placement errors (PPEs) according to one embodiment.

Referring to FIG. 4B, an expanded view of the petals 210a-210d corresponding to respective exposure fields 208a-208d for determining petal placement errors (PPEs) is depicted. As previously indicated, petals 210a-210d may form blossom image 214. Based on vector arithmetic, the petal placement errors between adjacent petal 210a and 210b of exposure fields 208a and 208b, respectively, is given above by Equation (1). Similarly, based on vector arithmetic, the petal placement errors between adjacent petal 210b and 210d of exposure fields 208b and 208d, respectively, may be given by:

$$PPE23 = (x2-x3, y2-D'_0-y3) \quad \text{Equation (2)}$$

Where they axis deviation (i.e., $y2-D'_0-y3$) is calculated as a function of the predetermined design distance (i.e., $D'_0$), the y-axis position (y2) of petal image 210b, and the y-axis position (y3) of petal image 210d. Since the x axes for these petals share a common origin, the x axis deviation may be given by x2–x3, which does not include a predetermined design distance. Accordingly, x2 is the x-axis position of petal image 210b, while x3 is the x-axis position of petal image 210d.

Also based on vector arithmetic, the petal placement errors between adjacent petal 210d and 210c of exposure fields 208d and 208c, respectively, may be given by:

$$PPE34 = (x3-D_0-x4, y3-y4) \quad \text{Equation (3)}$$

Where the x axis deviation (i.e., $x3-D_0-x4$) is calculated as a function of the predetermined design distance (i.e., $D_0$), the x-axis position (x3) of petal image 210d, and the x-axis position (x4) of petal image 210c. Since they axes for these petals share a common origin, they axis deviation may be given by y3-y4, which does not include a predetermined design distance. Accordingly, y3 is the y-axis position of petal image 210d, while y4 is the y-axis position of petal image 210c.

Finally, based on vector arithmetic, the petal placement errors between adjacent petal 210c and 210a of exposure fields 208c and 208a, respectively, may be given by:

$$PPE41 = (x4-x1, y4+D'_0-y1) \quad \text{Equation (4)}$$

Where they axis deviation (i.e., $y4+D'_0-y1$) is calculated as a function of the predetermined design distance (i.e., $D'_0$), the y-axis position (y4) of petal image 210c, and the y-axis position (y1) of petal image 210a. Since the x axes for these petals share a common origin, the x axis deviation may be given by x4–x1, which does not include a predetermined design distance. Accordingly, x4 is the x-axis position of petal image 210c, while x1 is the x-axis position of petal image 210a.

In the above equations, the predetermined design distance $D_0$ between petals 210a and 210b may, as previously described, be ascertained as the required distance between petals 210a and 210b taken from the edge 205, 207 of each field 208a, 208b to form an abutted non-overlapping positional relationship. Also, the predetermined design distance $D_0$ between petals 210c and 210d may be ascertained as the required distance between petals 210c and 210d taken from the edge 217, 219 of each field 208c, 208d to form an abutted non-overlapping positional relationship.

Similarly, the predetermined design distance $D'_0$ between petals 210b and 210d may be ascertained as the required distance between petals 210b and 210d taken from the edge 211, 213 of each field 208b, 208d to form an abutted non-overlapping positional relationship. Also, the predetermined design distance $D'_0$ between petals 210a and 210c may be ascertained as the required distance between petals 210a and 210c taken from the edge 223, 221 of each field 208a, 208c to form an abutted non-overlapping positional relationship. Thus, using Equations (1)-(4), the PPEs that are indicative of stitching errors between stitched exposure fields 208a-208d are determined (304).

Referring back to FIG. 3, subsequently, at 306 a statistical average for these determined PPEs may be calculated. For example, an average value may be determined by:

$$PPE_{av} = \frac{PPE12 + PPE23 + PPE34 + PPE41}{4} \quad \text{Equation (5)}$$

The calculated statistical average for PPEs (306) may be used in a threshold comparison. For example, at 308, the calculated statistical average for PPEs (306) may be compared to a threshold value. According to one exemplary implementation, the threshold value may be set to be about 10% of the node technology. Thus, for a 10 nm node, the threshold may be set to a tolerance of 1 nm.

Based on this numerical example, if the calculated statistical average for PPEs (306) is less than the 1 nm threshold, the process continues to image and analyze other blossom targets (302-306). Alternatively, if the calculated statistical average for the PPEs (306) exceeds the 1 nm threshold, at processes 310-314 corrective coefficients are generated for use by the lithographic tool in order to correct the exposure of the fields and reduce the stitching errors. It may be appreciated that different thresholds may be set based on the stringency of the stitching requirements. For example, if the stitched fields collectively form an electrical connectivity pattern on a metal layer associated with the back-end-of-the-line (BEOL) of a single device, a minimized field stitching error may be required in order to maintain the integrity of the electrical connectivity between the exposure fields.

Figure 5:
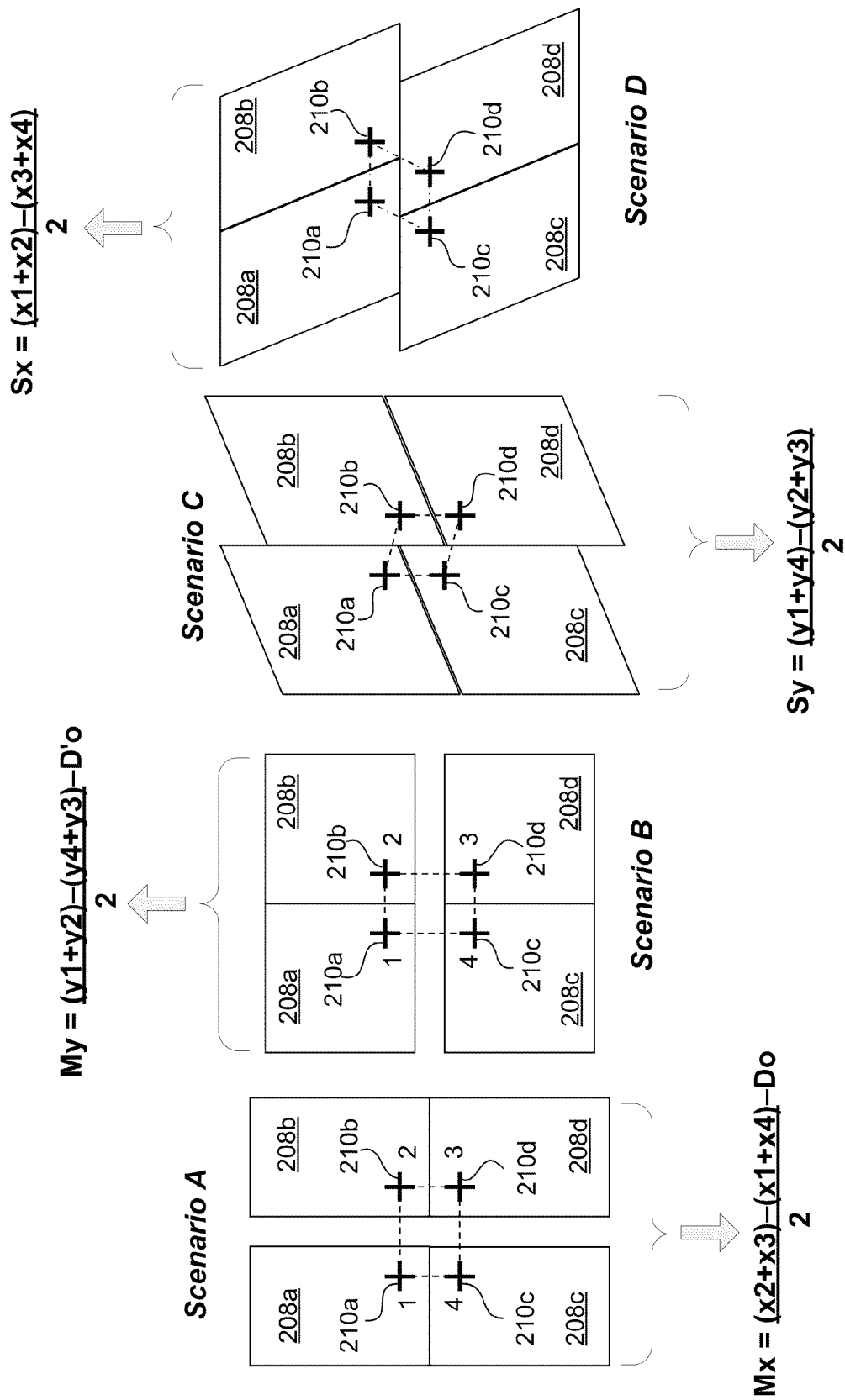
FIG. 5 illustrates the correction provided to the stitched exposure fields by determined average field error parameters according to one embodiment.

At 310, the average field errors may be determined based on the x and y coordinate positions of the petals 210a-210d (FIG. 4B) within blossom 214 (FIG. 4B). As determined below in Equations (6)-(9), the average field error parameters may be given by Mx, My, Sy, and Sx. Referring to FIG. 5, the parameters that correct the exposure fields by each average field error parameter is depicted. Once the PPE calculations indicate that a lithographic re-work (i.e., strip resist, deposit new resist, and re-expose) is needed, the average field error parameters given by Mx, My, Sy, and Sx are fed back to the lithography tool in order to correct the stitching errors associated with the exposure fields.

As depicted, Mx, which is associated with magnification in the x direction, provides a field correction parameter for the exposure fields 208a-208d shown in Scenario A, whereby:

$$Mx = \frac{(x2+x3)-(x1+x4)}{2} - D_0 \quad \text{Equation (6)}$$

Accordingly, x1 is the x-axis position of petal image 210a, x4 is the x-axis position of petal image 210c, x2 is the x-axis position of petal image 210b, x3 is the x-axis position of petal image 210d, and $D_0$ is the predetermined design distance described above in relation to FIG. 4B.

As depicted, My, which is associated with magnification in the y direction, provides a field correction parameter for the exposure fields 208a-208d shown in Scenario B, whereby:

$$My = \frac{(y1 + y2) - (y4 + y3)}{2} - D'_0 \quad \text{Equation (7)}$$

Accordingly, y1 is the y-axis position of petal image 210a, y4 is the y-axis position of petal image 210c, y2 is the y-axis position of petal image 210b, y3 is the y-axis position of petal image 210d, and $D'_0$ is the predetermined design distance described above in relation to FIG. 4B.

As depicted, Sy, which is associated with skew in the y direction, provides a field correction parameter for the exposure fields 208a-208d shown in Scenario C, whereby:

$$Sy = \frac{(y1 + y4) - (y2 + y3)}{2} \quad \text{Equation (8)}$$

Accordingly, y1 is the y-axis position of petal image 210a, y4 is the y-axis position of petal image 210c, y2 is the y-axis position of petal image 210b, and y3 is the y-axis position of petal image 210d.

As depicted, Sx, which is associated with skew in the x direction, provides a field correction parameter for the exposure fields 208a-208d shown in Scenario D, whereby:

$$Sx = \frac{(x1 + x2) - (x3 + x4)}{2} \quad \text{Equation (9)}$$

Accordingly, x1 is the x-axis position of petal image 210a, x4 is the x-axis position of petal image 210c, x2 is the x-axis position of petal image 210b, and x3 is the x-axis position of petal image 210d.

Referring back to FIG. 3, additionally, at 312 the field-to-field step-and-scan error parameters associated with the lithography tool may be determined based on the x and y coordinate values of the petal images 210a-210d. Once determined, the field-to-field step-and-scan error parameters may be fed back along with the average field error parameters to the lithography tool in order to correct the stitching errors associated with the exposure fields 210a-210d. As determined below in Equations (10)-(12), the field-to-field step-and-scan error parameters may be given by SUSD1y, SUSD2y, and SRSLx, whereby SUSD (Scan Up, Scan Down) refers to field-specific scan direction of the wafer and SRSL (Step Right, Step Left) refers to field-specific step direction of the wafer.

Figure 6:
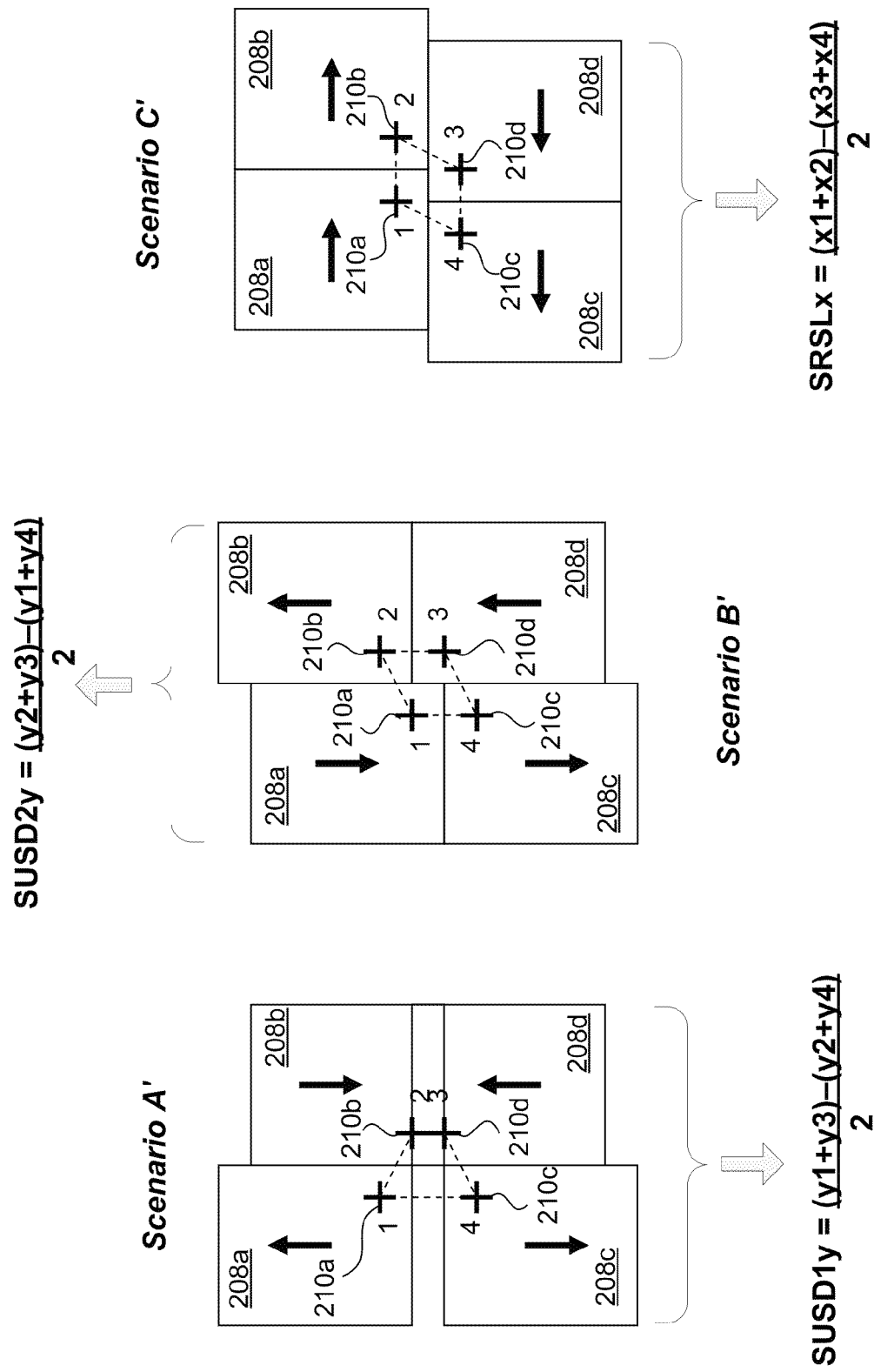
FIG. 6 illustrates the correction provided to the stitched exposure fields by determined field-to-field step-and-scan error parameters according to one embodiment.

Referring to FIG. 6, as depicted, SUSD1y, which is associated with y direction field errors based on the field specific scan direction of the wafer within the lithography tool, provides a field-to-field scanning error parameter for the exposure fields 208a-208d shown in Scenario A', whereby:

$$SUSD1y = \frac{(y1 + y3) - (y2 + y4)}{2} \quad \text{Equation (10)}$$

Accordingly, y1 is the y-axis position of petal image 210a, y4 is the y-axis position of petal image 210c, y2 is the y-axis position of petal image 210b, and y3 is the y-axis position of petal image 210d.

As further depicted, SUSD2y, which is also associated with y direction field errors based on the field specific scan direction of the wafer within the lithography tool, provides a field-to-field scanning error parameter for the exposure fields 208a-208d shown in Scenario B', whereby:

$$SUSD2y = \frac{(y2 + y3) - (y1 + y4)}{2} \quad \text{Equation (11)}$$

Accordingly, y1 is the y-axis position of petal image 210a, y4 is the y-axis position of petal image 210c, y2 is the y-axis position of petal image 210b, and y3 is the y-axis position of petal image 210d.

Moreover, SRSLx, which is associated with x direction field errors based on the field-specific step direction of the wafer within the lithography tool, provides a field-to-field stepping error parameter for the exposure fields 208a-208d shown in Scenario C', whereby:

$$SRSLx = \frac{(x1 + x2) - (x3 + x4)}{2} \quad \text{Equation (12)}$$

Accordingly, x1 is the x-axis position of petal image 210a, x4 is the x-axis position of petal image 210c, x2 is the x-axis position of petal image 210b, and x3 is the x-axis position of petal image 210d.

Referring back to FIG. 3, at 314, the determined average field error parameters and field-to-field step-and-scan error parameters using Equations (6)-(12) are sent to the lithography tool 320 for a re-working of the lithography process. For example, a re-working of the lithography process may include striping an existing exposed photoresist layer from the semiconductor device surface, depositing a new photoresist layer, and re-exposing the new photoresist layer. Thus, during the re-work, the photoresist layer including the exposure fields 208a-208d (FIG. 4B) are stripped away. A new photo-resist layer is then deposited, whereby fields 208a-208d (FIG. 4B) are re-exposed by the lithography tool 320 onto the new photo-resist layer based on the lithography tool 320 receiving and utilizing the determined average field error parameters and the field-to-field step-and-scan error parameters.

Figure 7:
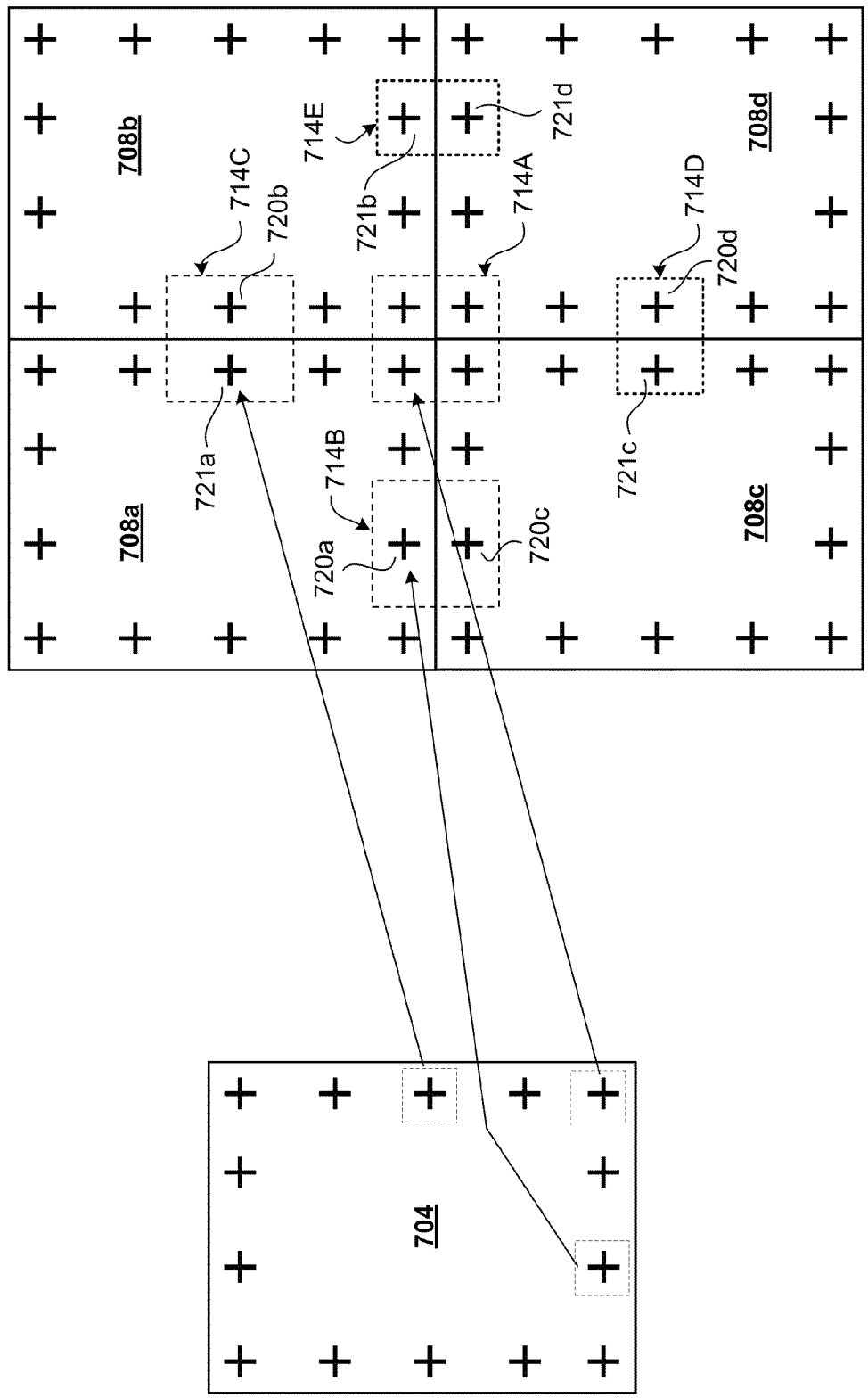
FIG. 7 illustrates a wafer stitching structure that includes imaging multiple blossoms for determining stitching errors according to one embodiment.

FIG. 7 illustrates a wafer stitching structure that includes imaging multiple blossoms for determining stitching errors according to one embodiment As depicted, the field stitching of image 704 by lithographic exposure and stepping using the lithography tool generates exposure fields 708a-708d, whereby the field stitching is carried out in a manner similar to that illustrated and described in relation to FIG. 2. In this embodiment, as depicted, each of the fields 708a-708d include petals located substantially along their entire periphery. Thus, during the metrology stage of determining the PPEs, in addition to measuring the petal positions for blossom 714A at the intersection of all four fields 708a-708d, additional blossoms formed by two-field intersections may be additionally utilized.

For example, blossom 714B, which includes petal 720a from exposure field 708a and petal 720c from exposure field 708c, may be additionally utilized to determine stitching errors between fields 708a and 708c. Also, for example, blossom 714C, which includes petal 721a from exposure field 708a and petal 720b from exposure field 708b, may be additionally utilized to determine stitching errors between fields 708a and 708b. In addition, exemplary blossom 714D, which includes petal 721c from exposure field 708c and petal 720d from exposure field 708d, may be utilized to determine stitching errors between fields 708c and 708d. Exemplary blossom 714E, which includes petal 721b from exposure field 708b and petal 721d from exposure field 708d, may be utilized to determine stitching errors between fields 708b and 708d.

The PPEs for blossom 714A may be determined using Equations (1)-(4), as described above in relation to FIG. 4B. The PPE for exemplary blossom 714B may be determined using Equation (2), while the PPE for exemplary blossom 714E may be determined using Equation (4). Accordingly, the PPE for exemplary blossom 714C may be determined using Equation (1), while the PPE for exemplary blossom 714D may be determined using Equation (3).

The implementation of FIG. 7 facilitates the stitching process by enabling a reduction in PPEs across the various stitched fields. This may be of significance when each field forms part of an integrated circuit pattern (e.g., metal layer connections) that is interconnected. In such a case, PPEs may cause an electrical connectivity failure between the interconnections of each stitched field. For example, the additional one or more blossoms 714B-714D may facilitate an increased stitching accuracy between the fields 708a-708d. Specifically, measuring the PPEs of blossom 714B in addition to blossom 714A may increase stitching accuracy and ensure that electrical connections between fields 708a and 708b are established. In such a scenario, if the PPEs are outside the required tolerances, the connections between fields 708a and 708b may miss each other, ultimately causing operational failures in the fabricated device. In the implementation of FIG. 7, each of the blossoms may be imaged within a separate FOV of a metrology tool when determining the PPEs. Thus, processing overheads associated with using additional blossoms may be offset against the stitching accuracies required. As previously described, an increased stitching accuracy may be necessary when each field forms part of a single integrated circuit pattern and interconnectivity of the fields become paramount.

Figure 8:
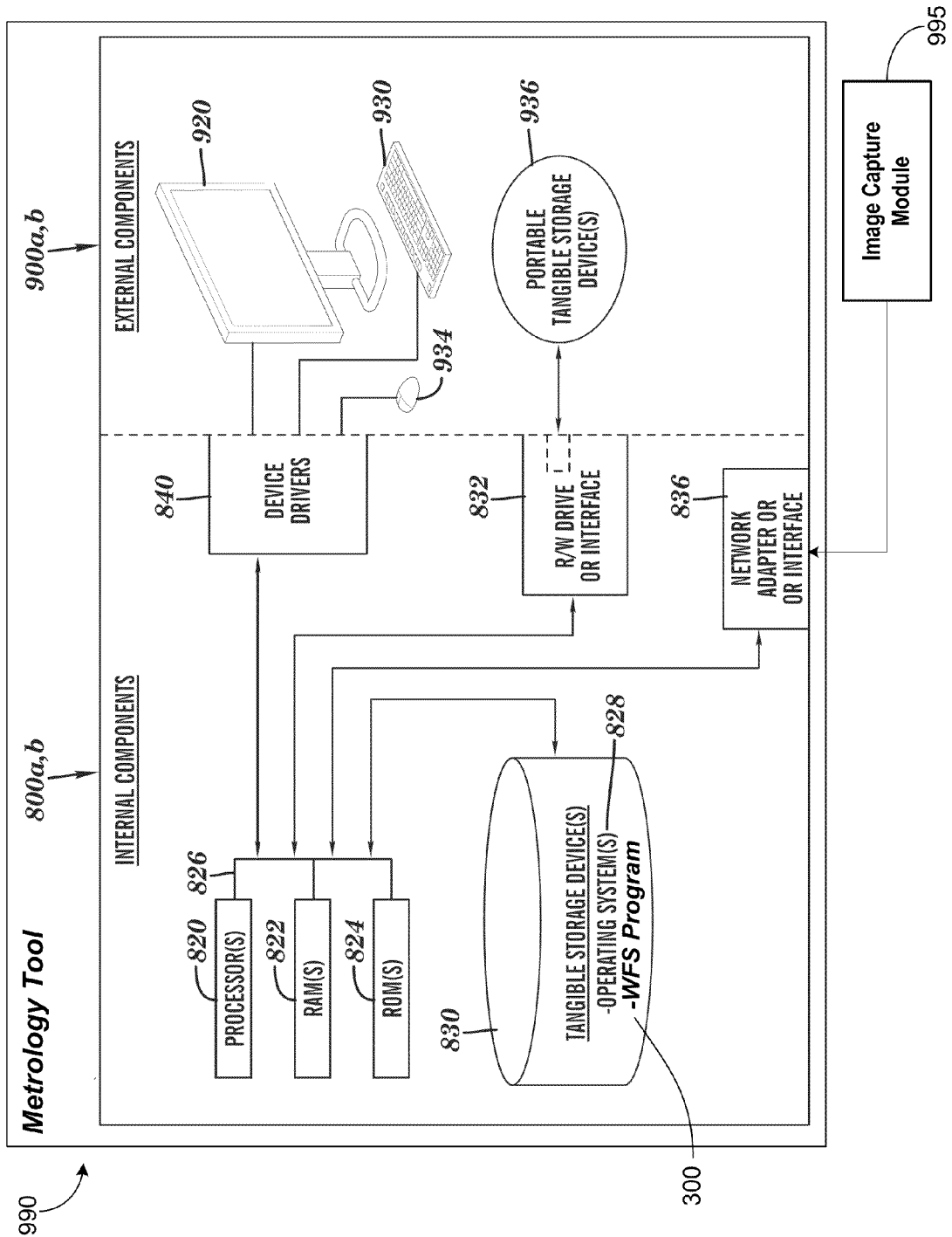
FIG. 8 is a block diagram of hardware and software within a metrology tool in accordance with one embodiment.

FIG. 8 shows a block diagram of the components of a data processing system 800, 900, within, for example, a metrology tool 990 in accordance with an illustrative embodiment of the present invention. It should be appreciated that FIG. 8 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Metrology tool 990 may include respective sets of internal components 800 a, b, c and external components 900 a, b, c, as illustrated in FIG. 8. Each of the sets of internal components 800 a, b, c includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and programs in metrology tool 990 is stored on one or more computer-readable tangible storage devices 830 for execution by one or more processors 820 via one or more RAMs 822 (which typically include cache memory). In the embodiment illustrated in FIG. 8, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Each set of internal components 800 a, b, c also includes a R/W drive or interface 832 to read from and write to one or more portable computer-readable tangible storage devices 936 such as a CD-ROM, DVD, memory stick, magnetic tape, magnetic disk, optical disk or semiconductor storage device. The WFS program 300 (also see FIG. 3) associated with metrology tool 990 can be stored on one or more of the respective portable computer-readable tangible storage devices 936, read via the respective R/W drive or interface 832 and loaded into the respective hard drive 830. Moreover, the one or more processors 820 may include an image processing module for executing any algorithms derived from WFS program 300 (also see FIG. 3). An imaging module 995 may, therefore, capture blossom images within its FOV for processing by the image processing module associated with the one or more processors 820. The captured images may be received by interface 836 and transferred along bus 826 to either or both the memory and the image processing module associated with the one or more processors 820. By executing the WFS program 300 (also see FIG. 3), the relative position of petal images within each blossom image may be generated.

Each set of internal components 800 a, b, c may also include network adapters (or switch port cards) or interfaces 836 such as a TCP/IP adapter cards, wireless wi-fi interface cards, or 3G or 4G wireless interface cards or other wired or wireless communication links. WFS program 300 (also see FIG. 3), in metrology tool 990, can be downloaded to metrology tool 990 from an external computer (e.g., server) via a network (for example, the Internet, a local area network or other, wide area network) and respective network adapters or interfaces 836. From the network adapters (or switch port adaptors) or interfaces 836, the WFS program 300 (also see FIG. 3) is loaded into the respective hard drive 830. The network may comprise copper wires, optical fibers, wireless transmission, routers, firewalls, switches, gateway computers and/or edge servers.

Each of the sets of external components 900 a, b, c can include a computer display monitor 920, a keyboard 930, and a computer mouse 934. External components 900 a, b, c can also include touch screens, virtual keyboards, touch pads, pointing devices, and other human interface devices. Each of the sets of internal components 800 a, b, c also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Java, Smalltalk, C, and C++. The program code may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown).

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various exemplary embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method of stitching multiple lithographically exposed fields on a semiconductor layer during a semiconductor manufacturing process, the method comprising:
   exposing a first lithographic field image on the semiconductor layer, the first lithographic field image having a first petal located substantially adjacent a peripheral edge of the first lithographic field image;
   exposing a second lithographic field image on the semiconductor layer, the second lithographic field image having a second petal located substantially adjacent a peripheral edge of the second lithographic field image;
   exposing a third lithographic field image on the semiconductor layer, the third lithographic field image having a third petal located substantially adjacent a peripheral edge of the third lithographic field image; and
   exposing a fourth lithographic field image on the semiconductor layer, the fourth lithographic field image having a fourth petal located substantially adjacent a peripheral edge of the fourth lithographic field image, the peripheral edge of the first, the second, the third, and the fourth lithographic field substantially abutting in a non-overlapping manner based on a predetermined design distance between the first, the second, the third, and the fourth petal,
   wherein the first, the second, the third, and the fourth petal are captured within a field-of-view (FOV) of a metrology tool for determining a stitching error between the first, the second, the third, and the fourth lithographic field image,
   wherein the first, the second, the third, and the fourth petal provide a position error indication corresponding to the substantially abutting of the peripheral edge of the first, the second, the third, and the fourth lithographic field,
   wherein the position error indication comprises measuring a placement error between the first and the second petal based on respective coordinates corresponding to the first and the second petal imaged on the semiconductor layer and a first predetermined design distance between the first and the second petal; and measuring a placement error between the third and the fourth petal based on respective coordinates corresponding to the third and the fourth petal imaged on the semiconductor layer and the first predetermined design distance between the third and the fourth petal.

2. The method of claim 1, wherein the FOV comprises about a 35 μm by 35 μm window.

3. The method of claim 1, wherein the position error indication comprises:
   measuring a placement error between the second and the third petal based on respective coordinates corresponding to the second and the third petal imaged on the semiconductor layer and a second predetermined design distance between the first and the second petal; and
   measuring a placement error between the first and the fourth petal based on respective coordinates corresponding to the first and the fourth petal imaged on the semiconductor layer and the second predetermined design distance between the third and the fourth petal.

4. The method of claim 1, wherein the first predetermined design distance comprises a distance, measureable by the metrology tool, from the peripheral edge of the first lithographic field to the first petal, and from the peripheral edge of the second lithographic field to the second petal.

5. The method of claim 3, wherein the second predetermined design distance comprises a distance, measureable by the metrology tool, from the peripheral edge of the second lithographic field to the second petal, and from the peripheral edge of the third lithographic field to the third petal.

6. The method of claim 3, further comprising:
   determining an average petal position error based on the placement error between the first and the second petal, the placement error between the second and the third petal, the placement error between the third and the fourth petal, and the placement error between the first and the fourth petal.

7. The method of claim 6, further comprising:
determining, based on the average petal position error exceeding a predetermined threshold value, linear field errors for the exposed first, the exposed second, the exposed third, and the exposed fourth lithographic field image.

8. The method of claim 7, further comprising:
determining, based on the average petal position error exceeding a predetermined threshold value, field-to-field step and scan translation errors for the exposed first, the exposed second, the exposed third, and the exposed fourth lithographic field image.

9. The method of claim 8, further comprising:
mitigating the determined average petal position error using both the determined linear field errors and the determined field-to-field step and scan translation errors.

10. The method of claim 1, wherein the exposed first lithographic field image comprises a first additional petal located adjacent the peripheral edge of the first lithographic field image, and wherein the exposed second lithographic field image comprises a second additional petal located adjacent the peripheral edge of the second lithographic field image, the first and the second additional petal captured within another field-of-view (FOV) of the metrology tool for determining another stitching error between the first and the second lithographic field image.

11. The method of claim 10, wherein the first and the second lithographic field image in aggregate form an integrated circuit pattern corresponding to a single device.

12. The method of claim 11, wherein the first, the second, the third, and the fourth lithographic field image are exposed onto the semiconductor layer by an extreme ultraviolet (EUV) radiation source.

13. A method of determining stitching errors in multiple lithographically exposed fields on a semiconductor layer during a semiconductor manufacturing process, the method comprising:
receiving a predetermined design distance corresponding to a plurality of petals associated with the multiple lithographically exposed fields;
identifying a blossom within a single field-of-view (FOV) of a metrology tool, the blossom formed by a non-overlapping abutment of corners corresponding to the multiple lithographically exposed fields, the blossom including the plurality of petals associated with the multiple lithographically exposed fields; and
calculating petal position errors based on both a coordinate position for each of the plurality of petals within the blossom and the predetermined design distance,
wherein the calculated petal position errors are indicative of stitching errors for the multiple lithographically exposed fields,
wherein calculating the petal position errors comprise:
measuring a placement error between the first and the second petal based on respective coordinates corresponding to the first and the second petal imaged on the semiconductor layer and the predetermined design distance; and
measuring a placement error between the third and the fourth petal based on respective coordinates corresponding to the third and the fourth petal imaged on the semiconductor layer and the predetermined design distance;
measuring a placement error between the second and the third petal based on respective coordinates corresponding to the second and the third petal imaged on the semiconductor layer and the predetermined design distance; and
measuring a placement error between the first and the fourth petal based on respective coordinates corresponding to the first and the fourth petal imaged on the semiconductor layer and the predetermined design distance.

14. The method of claim 13, wherein the FOV comprises about a 35 µm by 35 µm window.

15. The method of claim 13, wherein the plurality of petals comprise a first, a second, a third, and a fourth petal each corresponding to one of the multiple lithographically exposed fields.

16. The method of claim 13, further comprising:
identifying another blossom within another single field-of-view (FOV) of a metrology tool, the another blossom formed by another plurality of petals associated with two of the multiple lithographically exposed fields having abutted edges that are non-overlapping.

17. A computer system for determining stitching errors in multiple lithographically exposed fields on a semiconductor layer during a semiconductor manufacturing process comprising:
a memory;
a processor in communication with the memory, the processor comprising an instruction fetching unit for fetching instructions from memory and one or more execution units for executing fetched instructions;
wherein said computer system is capable of performing a method comprising:
receiving a predetermined design distance corresponding to a plurality of petals associated with the multiple lithographically exposed fields;
identifying a blossom within a single field-of-view (FOV) of a metrology tool, the blossom formed by a non-overlapping abutment of corners corresponding to the multiple lithographically exposed fields, the blossom including the plurality of petals associated with the multiple lithographically exposed fields; and
calculating petal position errors based on both a coordinate position for each of the plurality of petals within the blossom and the predetermined design distance,
wherein the calculated petal position errors are indicative of stitching errors for the multiple lithographically exposed fields,
wherein calculating the petal position errors comprise:
measuring a placement error between the first and the second petal based on respective coordinates corresponding to the first and the second petal imaged on the semiconductor layer and the predetermined design distance; and
measuring a placement error between the third and the fourth petal based on respective coordinates corresponding to the third and the fourth petal imaged on the semiconductor layer and the predetermined design distance;
measuring a placement error between the second and the third petal based on respective coordinates corresponding to the second and the third petal imaged on the semiconductor layer and the predetermined design distance; and
measuring a placement error between the first and the fourth petal based on respective coordinates corresponding to the first and the fourth petal imaged on the semiconductor layer and the predetermined design distance.

* * * * *